(12) United States Patent
Fu et al.

(10) Patent No.: US 9,573,805 B2
(45) Date of Patent: Feb. 21, 2017

(54) MEMS PRESSURE SENSOR AND METHOD OF MANUFACTURING THE SAME

(71) Applicant: Semiconductor Manufacturing International (Shanghai) Corporation, Shanghai (CN)

(72) Inventors: Guangcai Fu, Shanghai (CN); Haiyong Ni, Shanghai (CN)

(73) Assignee: Semiconductor Manufacturing International (Shanghai) Corporation (CN)

( * ) Notice: Subject to any disclaimer, the term of this patent is extended or adjusted under 35 U.S.C. 154(b) by 0 days.

(21) Appl. No.: 14/713,946

(22) Filed: May 15, 2015

(65) Prior Publication Data

US 2015/0368096 A1    Dec. 24, 2015

(30) Foreign Application Priority Data

Jun. 19, 2014 (CN) .......................... 2014 1 0276142

(51) Int. Cl.
  *G01L 9/00* (2006.01)
  *B81C 1/00* (2006.01)
  *B81B 7/00* (2006.01)
  *B81B 3/00* (2006.01)

(52) U.S. Cl.
  CPC .......... *B81C 1/00531* (2013.01); *B81B 3/007* (2013.01); *B81B 7/0058* (2013.01); *B81C 1/00801* (2013.01); *G01L 9/0073* (2013.01); *B81B 2201/0264* (2013.01); *B81C 1/00849* (2013.01)

(58) Field of Classification Search
  USPC ..... 257/419, E29.324, 414–416; 438/50, 52; 310/322, 348
  See application file for complete search history.

(56) References Cited

U.S. PATENT DOCUMENTS

| | | | | |
|---|---|---|---|---|
| 7,301,213 | B2 * | 11/2007 | Matsubara | B06B 1/0292 257/416 |
| 8,148,792 | B2 * | 4/2012 | Nakatani | G01L 9/0016 257/318 |
| 2011/0170735 | A1 * | 7/2011 | Dehe | H04R 19/005 381/386 |
| 2011/0278683 | A1 * | 11/2011 | Kasai | H04R 19/005 257/416 |
| 2012/0161257 | A1 * | 6/2012 | Friza | B81C 1/00047 257/416 |
| 2013/0129118 | A1 * | 5/2013 | Mao | H04R 19/005 381/174 |

(Continued)

*Primary Examiner* — Tram H Nguyen
(74) *Attorney, Agent, or Firm* — Innovation Counsel LLP

(57) ABSTRACT

A method of manufacturing a pressure sensor is provided. The method includes: providing a substrate, wherein a bottom electrode and a pressure sensing film are disposed on the substrate; forming an etch stop assembly on the pressure sensing film at a location corresponding to a pressure trench; forming a cover layer on the substrate covering the etch stop assembly and the pressure sensing film; forming a mask layer on the cover layer, wherein an opening of the mask layer is formed above the etch stop assembly and exposes a portion of the cover layer at the location corresponding to the pressure trench; etching the cover layer using the mask layer so as to form the pressure trench in the cover layer; removing the etch stop assembly at a bottom of the pressure trench; and removing the mask layer.

15 Claims, 9 Drawing Sheets

(56) References Cited

U.S. PATENT DOCUMENTS

2013/0223023 A1\* 8/2013 Dehe ................. B81B 7/0029
361/752
2014/0225204 A1\* 8/2014 Nakagawa ............ H04R 19/04
257/416

\* cited by examiner

US 9,573,805 B2

MEMS PRESSURE SENSOR AND METHOD OF MANUFACTURING THE SAME

CROSS-REFERENCE TO RELATED APPLICATION

This application claims priority to Chinese Patent Application No. 201410276142.0 filed Jun. 19, 2014, the disclosure of which is incorporated herein by reference in its entirety.

BACKGROUND

Technical Field

The present disclosure generally relates to the field of semiconductor technology, and more particularly to a MEMS pressure sensor and method of manufacturing the same.

Description of the Related Art

With the continuous development of semiconductor technology, microelectromechanical systems (MEMS) pressure sensors are widely used in many applications. An existing method of manufacturing a MEMS pressure sensor may include the following steps. First, a coating layer is formed on a pressure sensing film disposed on a substrate. Next, a pressure trench is formed on the coating layer through a patterning process, so as to expose the pressure sensing film. The pressure trench (also known as a shutter) is used to sense an external pressure.

However, during the patterning process, unwanted etching of the pressure sensing film may occur at the bottom of the pressure trench, which may subsequently affect the electrical test results and reliability of the MEMS pressure sensor.

SUMMARY

The present disclosure addresses at least the above issues in the prior art.

According to an embodiment of the inventive concept, a method of manufacturing a pressure sensor is provided. The method includes: providing a substrate, wherein a bottom electrode and a pressure sensing film are disposed on the substrate; forming an etch stop assembly on the pressure sensing film at a location corresponding to a pressure trench; forming a cover layer on the substrate covering the etch stop assembly and the pressure sensing film; forming a mask layer on the cover layer, wherein an opening of the mask layer is formed above the etch stop assembly and exposes a portion of the cover layer at the location corresponding to the pressure trench; etching the cover layer using the mask layer so as to form the pressure trench in the cover layer; removing the etch stop assembly at a bottom of the pressure trench; and removing the mask layer.

In some embodiments, forming the etch stop assembly may further include: forming an etch stop layer on the substrate covering the pressure sensing film; forming a mask layer on the etch stop layer, wherein the mask layer may be formed covering a portion of the etch stop layer at the location corresponding to the pressure trench; etching the etch stop layer using the mask layer to remove portions of the etch stop layer that are not covered by the mask layer; and removing the mask layer.

In some embodiments, the etch stop layer may be etched by dry etching using etchant gases including Ar, $O_2$, and $C_4F_8$.

In some embodiments, process conditions of the dry etching may include: Ar at a flow rate of 150 sccm, $O_2$ at a flow rate of 17 sccm, $C_4F_8$ at a flow rate of 15 sccm, a pressure of 80 mtorr, a source power of 1600 W, and a bias power of 800 W.

In some embodiments, the etch stop assembly may include silicon oxide or amorphous carbon.

In some embodiments, the pressure sensing film may include SiGe.

In some embodiments, the cover layer may include silicon nitride.

In some embodiments, the cover layer may be etched by dry etching using etchant gases including Ar, $O_2$, $CF_4$, and $CHF_3$.

In some embodiments, process conditions of the dry etching may include: Ar at a flow rate of 200 sccm, $O_2$ at a flow rate of 18 sccm, $CF_4$ at a flow rate of 80 sccm, $CHF_3$ at a flow rate of 25 sccm, a process pressure of 125 mtorr, a source power of 1000 W, and a bias power of 1000 W.

In some embodiments, the cover layer may be etched by dry etching using etchant gases including $SF_6$, $CF_4$, $CHF_3$, and Ar.

In some embodiments, process conditions of the dry etching may include: $SF_6$ at a flow rate of 25 sccm, $CF_4$ at a flow rate of 40 sccm, $CHF_3$ at a flow rate of 25 sccm, Ar at a flow rate of 300 sccm, a process pressure of 140 mtorr, a source power of 1700 W, and a bias power of 500 W.

In some embodiments, the etch stop assembly may be removed by dry etching using etchant gases including Ar, $CF_4$, and $CHF_3$.

In some embodiments, process conditions of the dry etching may include: Ar at a flow rate of 200 sccm, $CF_4$ at a flow rate of 15 sccm, $CHF_3$ at a flow rate of 45 sccm, a process pressure of 95 mtorr, and a source power of 300 W.

In some embodiments, the method may further include: performing a wet cleaning step after the etch stop assembly is removed.

According to another embodiment of the inventive concept, a pressure sensor is provided. The pressure sensor includes: a substrate; a bottom electrode and a pressure sensing film disposed on the substrate; a cover layer disposed on the substrate covering the pressure sensing film, wherein the cover layer includes at least one pressure trench formed in the cover layer, and wherein the cover layer is disposed in direct contact with the pressure sensing film.

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

DETAILED DESCRIPTION

Figure 1A:
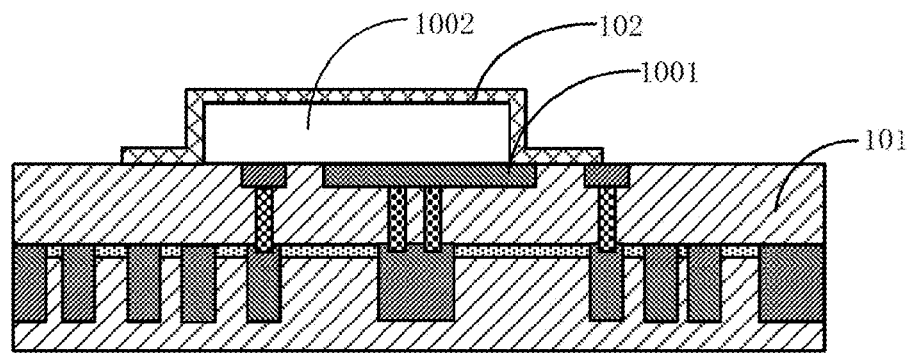
FIGS. 1A, 1B, 1C, 1D, 1E, and 1F illustrate cross-sectional views of a MEMS pressure sensor at different stages of fabrication according to a method of manufacturing the MEMS pressure sensor.

Various embodiments of the inventive concept are next described in detail with reference to the accompanying drawings. It is noted that the following description of the different embodiments is merely illustrative in nature, and is not intended to limit the inventive concept, its application, or use. The relative arrangement of the components and steps, and the numerical expressions and the numerical values set forth in these embodiments do not limit the scope of the inventive concept unless otherwise specifically stated. In addition, techniques, methods, and devices as known by those skilled in the art, although omitted in some instances, are intended to be part of the specification where appropriate. It should be noted that for convenience of description, the sizes of the elements in the drawings may not be drawn to scale. In the drawings, the size and/or relative sizes of layers and regions may be exaggerated for clarity. Like reference numerals denote the same elements throughout.

Ordinary skill in the relevant art known techniques, methods and apparatus may not be discussed in detail, but in the application of these techniques, methods and apparatus, these techniques, methods and apparatus should be considered as part of this specification.

The terminology used herein is for the purpose of describing particular embodiments and is not intended to limit the inventive concept. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

It should be understood that when an element or layer is referred to as "in", "on", "adjacent to", "connected to", or "coupled to" another element or layer, it can be directly on the other element or layer, adjacent, connected or coupled to the other element or layer, or with one or more intervening elements or layers being present. In contrast, when an element is referred to as being "directly on," "directly adjacent with", "directly connected to" or "directly coupled to" another element or layer, no intervening elements or layers are present.

It will be understood that, although the terms "first," "second," "third," etc. may be used herein to describe various elements, the elements should not be limited by those terms. Instead, those terms are merely used to distinguish one element from another. Thus, a "first" element discussed below could be termed a "second" element without departing from the teachings of the present inventive concept. As used herein, the term "and/or" includes any and all combinations of one or more of the associated listed items.

Spatially relative terms, such as "below," "lower," "under," "above," "upper" and the like, may be used herein to describe the spatial relationship of one element or feature to another element(s) or feature(s) as illustrated in the figures. It will be understood that the spatially relative terms are intended to encompass different orientations of the device during use or operation, in addition to the orientation depicted in the figures. For example, if the device in the figures is turned over, elements described as "below" or "beneath" relative to other elements or features would then be oriented "above" relative to the other elements or features. Thus, the example term "below" can encompass both an orientation of above and below, depending on the orientation of the elements. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art, and should not be interpreted in an idealized or overly formal sense unless expressly so defined herein.

Various embodiments, including methods and techniques, are described in this disclosure. Embodiments of the invention may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out operations pertaining to embodiments of the invention. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the invention.

It should be understood that the inventive concept is not limited to the embodiments described herein. Rather, the inventive concept may be modified in different ways to realize different embodiments.

First, a method of manufacturing a MEMS pressure sensor is described with reference to FIGS. 1A through 1F. Specifically, FIGS. 1A, 1B, 1C, 1D, 1E, and 1F illustrate cross-sectional views of a MEMS pressure sensor at different stages of fabrication according to the method of manufacturing the MEMS pressure sensor. The method may be used to improve a shutter etching process, and includes the following steps.

Referring to FIG. 1A, a bottom electrode 1001 and a pressure sensing film 102 are disposed on a substrate 101 (Step E1).

As shown in FIG. 1A, the bottom electrode 1001 is disposed within the substrate 101, and the pressure sensing film 102 is disposed on top of the substrate 101. A pressure sensor cavity 1002 is disposed between the pressure sensing film 102 and the substrate 101. Specifically, the pressure sensor cavity 1002 is disposed above a top portion of the bottom electrode 1001. It is noted that other components such as transistors and interconnects may also be formed within the substrate 101.

Figure 1B:
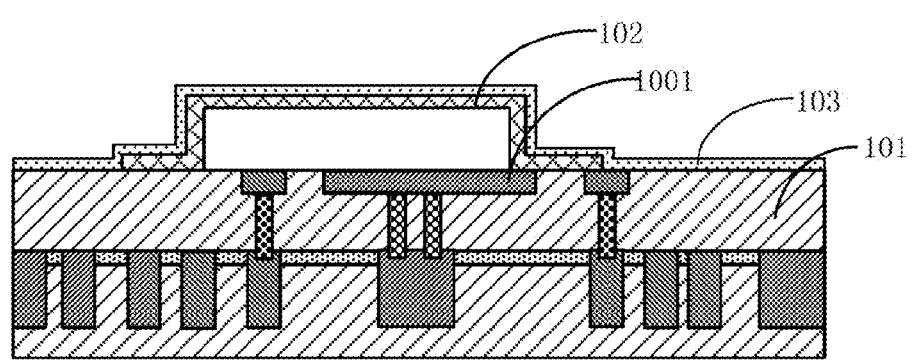

Referring to FIG. 1B, an etch stop layer 103 is formed on the substrate 101 covering the pressure sensing film 102 (Step E2).

Figure 1C:
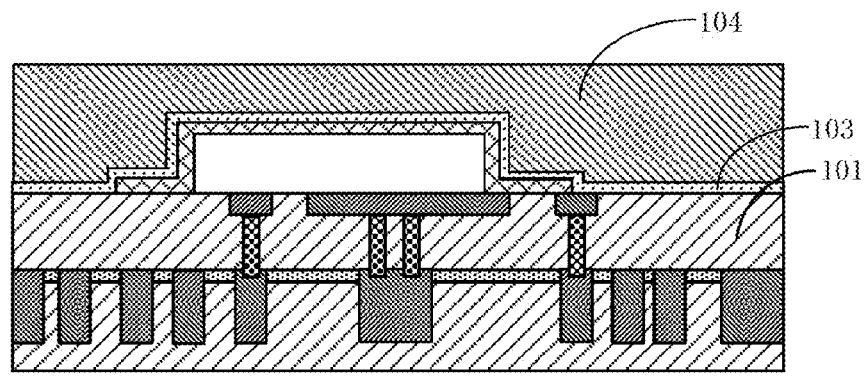

Referring to FIG. 1C, a cover layer 104 is formed covering the etch stop layer 103 (Step E3).

In some embodiments, the pressure sensing film 102 may be made of SiGe. In some embodiments, the etch stop layer 103 may be made of silicon oxide. In some embodiments, the cover layer 104 may be made of silicon nitride. In some embodiments, a thickness of the cover layer 104 may range from about 20 KÅ to about 30 KÅ.

Figure 1D:
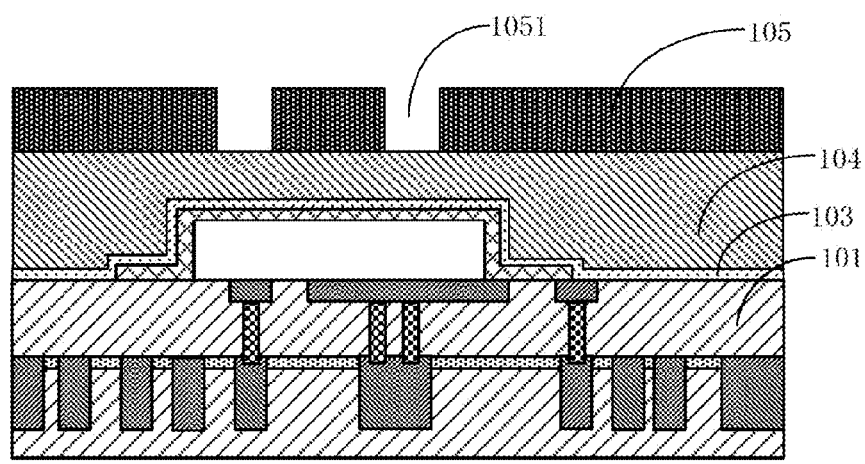

Referring to FIG. 1D, a patterned photoresist layer 105 is formed on the cover layer 104 (Step E4). As shown in FIG. 1D, the patterned photoresist layer 105 includes an opening 1051 at a location corresponding to where a pressure trench is to be formed. In the example of FIG. 1D, two openings 1051 are illustrated. However, it is noted that any number of openings 1051 may be contemplated.

Figure 1E:
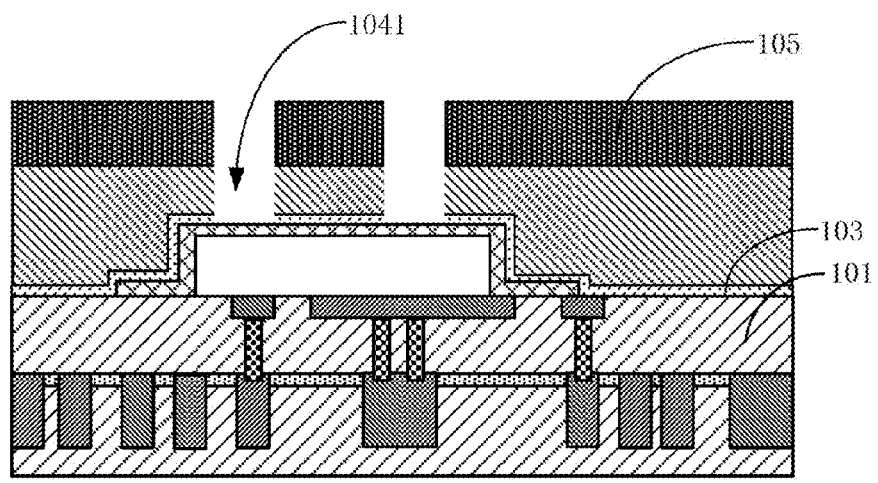

Referring to FIG. 1E, the cover layer 104 is etched using the patterned photoresist layer 105 as a mask, so as to form a pressure trench 1041 within the cover layer 104 (Step E5). Next, the portion of the etch stop layer 103 at the bottom of the pressure trench 1041 is removed (Step E6), resulting in the structure shown in FIG. 1E.

In the example of FIG. 1E, two pressure trenches 1041 are illustrated. However, it is noted that any number pressure trenches 1041 may be contemplated.

Figure 1F:
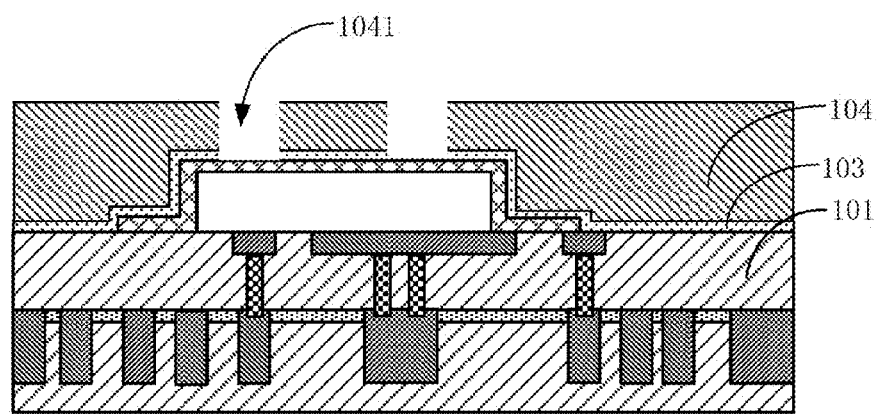

Finally, referring to FIG. 1F, the patterned photoresist layer 105 is removed (Step E7).

The pressure trench 1041 (also known as a shutter) is used to sense an external pressure. The etching of the cover layer 104 to form the pressure trench 1041 is commonly known as a shutter etching (shutter-ET) process.

Referring to FIGS. 1D through 1F, since the etch stop layer 103 is disposed between the pressure sensing film 102 and the cover layer 104, unwanted etching of the pressure sensing film 102 during the patterning of the cover layer 104 (to form the pressure trench 1041) may be prevented.

However, as shown in FIG. 1F, the etch stop layer 103 still remains between the pressure sensing film 102 and the cover layer 104 in the resulting pressure sensor. In some instances, stress (mainly compressive stress) exerted by the etch stop layer 103 may cause the coating layer 104 and the pressure sensing film 102 to deform (distort). The deformation (distortion) of the coating layer 104 and the pressure sensing film 102 may reduce the sensitivity of the pressure sensor and result in sensor drift.

To mitigate the above issues, the inventive concept provides an exemplary method of a manufacturing a MEMS pressure sensor. The exemplary method can reduce unwanted etching of the pressure sensing film at the bottom of the pressure trench. In addition, deformation (distortion) of the coating layer and pressure sensing film can be prevented in a pressure sensor manufactured using the exemplary method. Accordingly, the reliability and sensitivity of the pressure sensor manufactured using the exemplary method is improved.

Figure 2A:
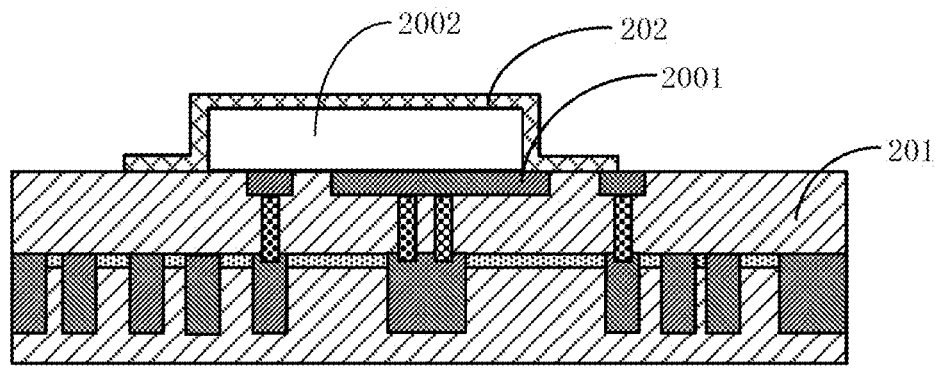
FIGS. 2A, 2B, 2C, 2D, 2E, 2F, 2G, and 2H illustrate cross-sectional views of a MEMS pressure sensor at different stages of fabrication according to an exemplary method of manufacturing the MEMS pressure sensor.
Figure 3:
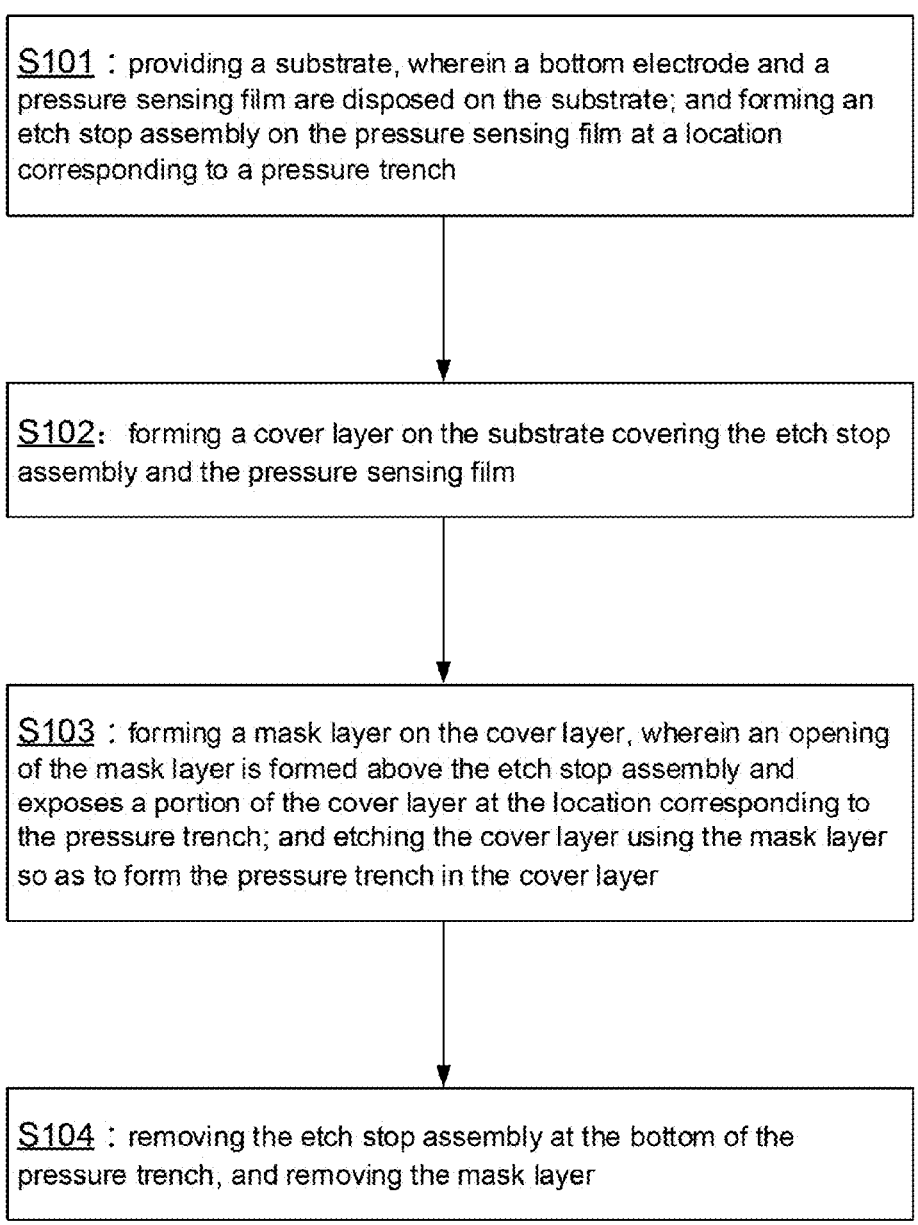
FIG. 3 is a flowchart of an exemplary method of manufacturing a MEMS pressure sensor according to an embodiment.

The exemplary method of manufacturing a MEMS pressure sensor will be described with reference to FIGS. 2A through 2H and FIG. 3. Specifically, FIGS. 2A, 2B, 2C, 2D, 2E, 2F, 2G, and 2H illustrate cross-sectional views of the MEMS pressure sensor at different stages of fabrication, and FIG. 3 is a flowchart of the exemplary method. The method includes the following steps:

Referring to FIG. 2A, a bottom electrode 2001 and a pressure sensing film 202 are disposed on a substrate 201 (Step A1).

As shown in FIG. 2A, the bottom electrode 2001 is disposed within the substrate 201, and the pressure sensing film 202 is disposed on top of the substrate 201. A pressure sensor cavity 2002 is disposed between the pressure sensing film 202 and the substrate 201. Specifically, the pressure sensor cavity 2002 is disposed on a top portion of the bottom electrode 2001. It is noted that other components such as transistors and interconnects may be formed within the substrate 201.

The pressure sensing film 202 serves as a top electrode. As a result, a pressure sensor capacitance is formed between the pressure sensing film 202 (top electrode) and the bottom electrode 2001. When the shape of the pressure sensing film 202 (top electrode) changes due to an external pressure, a gap (distance) between the pressure sensing film 202 and the bottom electrode 2001 changes. The change in gap (distance) changes the capacitance, thus allowing the external pressure to be sensed.

The pressure sensing film 202 may be made of SiGe or any other suitable material.

It is noted that the structure in FIG. 2A may be formed using different methods, and need not be limited to the steps described above.

Figure 2B:
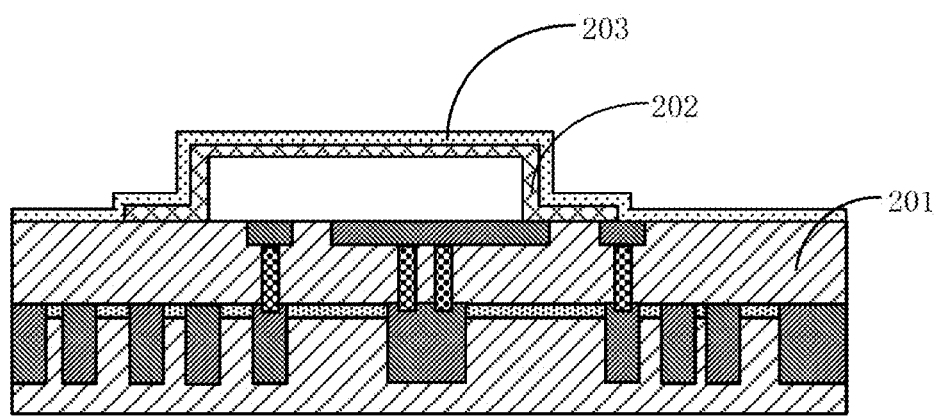
Figure 2C:
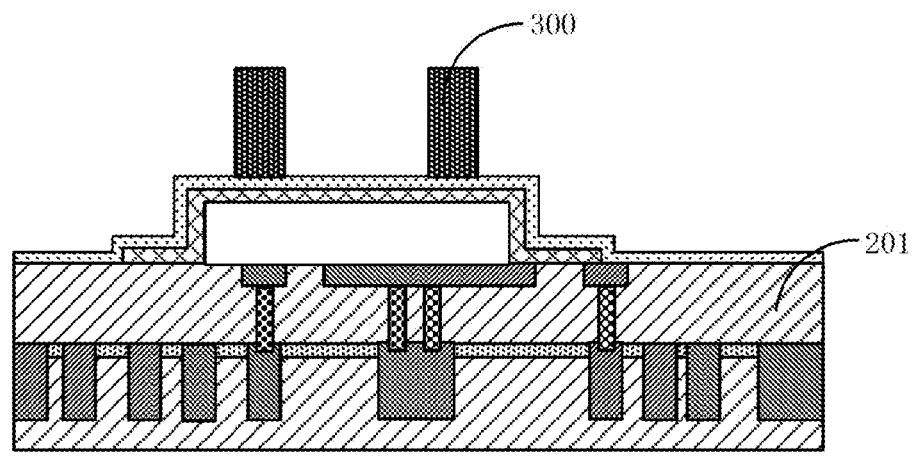
Figure 2D:
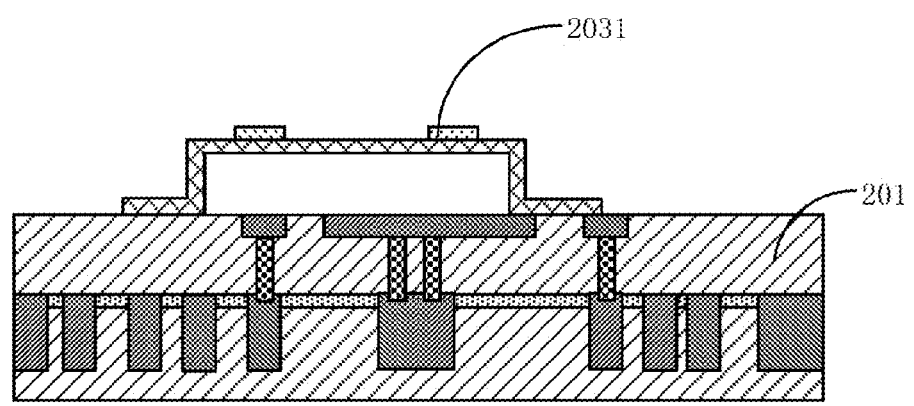

Referring to FIG. 2D, an etch stop assembly 2031 is formed on the pressure sensing film 202 at a location corresponding to where a pressure trench is to be formed (Step A2).

The etch stop assembly 2031 may be made of silicon oxide, amorphous carbon, or any other suitable material. The shape and size of the etch stop assembly 2031 may be configured to match the bottom portion of the pressure trench. In other words, the etch stop assembly 2031 may have a same or similar shape as the bottom portion of the pressure trench, and an area of the etch stop assembly 2031 may be equal to or greater than an area of the bottom portion of the pressure trench.

In some embodiments, Step A2 may further include the following Steps A21, A22, and A23.

Referring to FIG. 2B, an etch stop layer 203 is formed on the substrate 201 covering the pressure sensing film 202 (Step A21).

In some embodiments, the etch stop layer 203 may be made of silicon oxide. The etch stop layer 203 may be formed using deposition or any other suitable methods.

Referring to FIG. 2C, a mask layer 300 is formed on the etch stop layer 203 (Step A22). The mask layer 300 is formed covering a portion of the etch stop layer 203 at the location corresponding to where the pressure trench is to be formed. As shown in FIG. 2C, other portions of the etch stop layer 203 (that are not covered by mask layer 300) are exposed.

The mask layer 300 may be made of a photoresist or any other suitable material.

In the example of FIG. 2C, the mask layer 300 is formed covering the portion of the etch stop layer 203 at two locations corresponding to where two respective pressure trenches are to be formed. However, it is noted that any number of locations of the pressure trenches may be contemplated.

Referring to FIG. 2D, the etch stop layer 203 is etched using the mask layer 300 to remove the portions of the etch stop layer 203 that are not covered by the mask layer 300, and the mask layer 300 is then removed, thereby forming the etch stop assembly 2031 (Step A23). As previously described, the etch stop assembly 2031 is formed on the pressure sensing film 202 at the location corresponding to where the pressure trench is to be formed.

Accordingly, the pattern of the mask layer 300 is transferred to the etch stop layer 203 upon completion of Step A23.

The etch stop layer 203 may be etched using dry etching or any other suitable etching method. It is noted that the etching method should have a high etch selectivity between the etch stop layer 203 and the pressure sensing film 202, so as to prevent unwanted etching of the pressure sensing film 202.

In some embodiments, the etch stop layer 203 may be etched by dry etching using etchant gases such as Ar, $O_2$, or $C_4F_8$. In those embodiments, the dry etching process conditions may include: Ar at a flow rate of 150 sccm, $O_2$ at a flow rate of 17 sccm, $C_4F_8$ at a flow rate of 15 sccm, a pressure of 80 mtorr, a source power of 1600 W, and a bias power of 800 W.

Figure 2E:
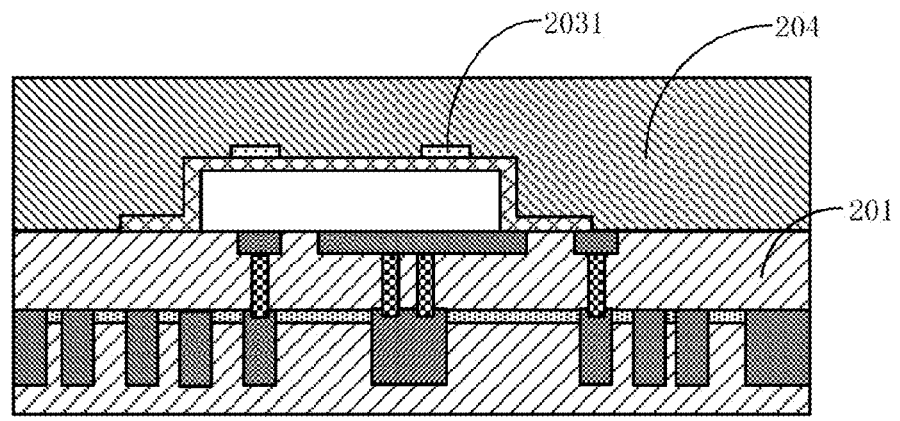

Referring to FIG. 2E, a cover layer 204 is formed on the substrate 201 covering the etch stop assembly 2031 and the pressure sensing film 202 (Step A3).

The cover layer 204 may be made of silicon nitride or any other suitable material. In some embodiments, a thickness of the cover layer 204 may be about 3 um. The cover layer 204 may be formed using deposition or any other suitable method.

Figure 2F:
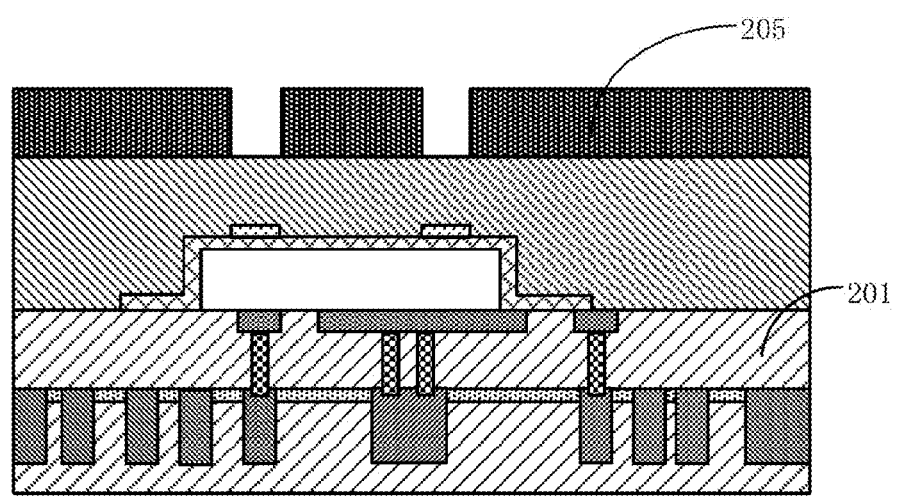

Referring to FIG. 2F, a mask layer 205 including an opening is formed on the cover layer 204 (Step A4). The opening of the mask layer 205 is formed above the etch stop assembly 2031. In particular, the opening of the mask layer 205 is formed exposing the portion of the cover layer 204 at the location corresponding to the pressure trench.

The mask layer 205 may be a patterned photoresist layer or any other type of suitable mask.

Figure 2G:
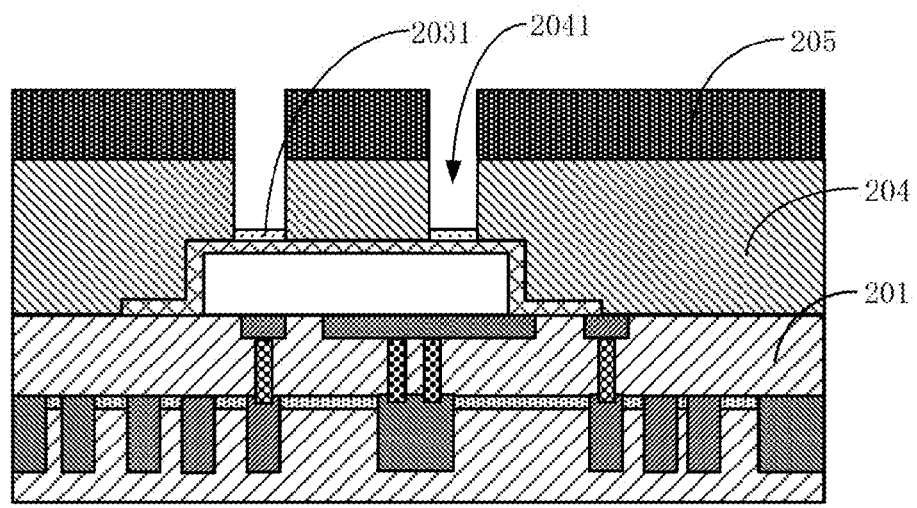

Referring to FIG. 2G, the cover layer 204 is etched using the mask layer 205, so as to form a pressure trench 2041 in the cover layer 204 (Step A5). In the example of FIG. 2G, two pressure trenches 2041 are illustrated. However, it is noted that any number of pressure trenches 2041 may be contemplated.

The cover layer 204 may be etched using dry etching or wet etching. The etching approximately terminates at the etch stop assembly 2031, so as to prevent unwanted etching on the pressure sensing film 202.

The pressure trench 2041 (also known as a shutter) is used to sense an external pressure. The etching of the cover layer 204 to form the pressure trench 2041 is commonly known as a shutter etching (shutter-ET) process.

In some embodiments, the cover layer 204 may be etched by dry etching using etchant gases including Ar, $O_2$, $CF_4$, and $CHF_3$. In those embodiments, the dry etching process conditions may include: Ar at a flow rate of 200 sccm, $O_2$ at a flow rate of 18 sccm, $CF_4$ at a flow rate of 80 sccm, $CHF_3$ at a flow rate of 25 sccm, a process pressure of 125 mtorr, a source power of 1000 W, and a bias power of 1000 W.

In other embodiments, the cover layer 204 may be etched by dry etching using etchant gases including $SF_6$, $CF_4$, $CHF_3$, and Ar. In those embodiments, the dry etching process conditions may include: $SF_6$ at a flow rate of 25 sccm, $CF_4$ at a flow rate of 40 sccm, $CHF_3$ at a flow rate of 25 sccm, Ar at a flow rate of 300 sccm, a process pressure of 140 mtorr, a source power of 1700 W, and a bias power of 500 W.

Figure 2H:
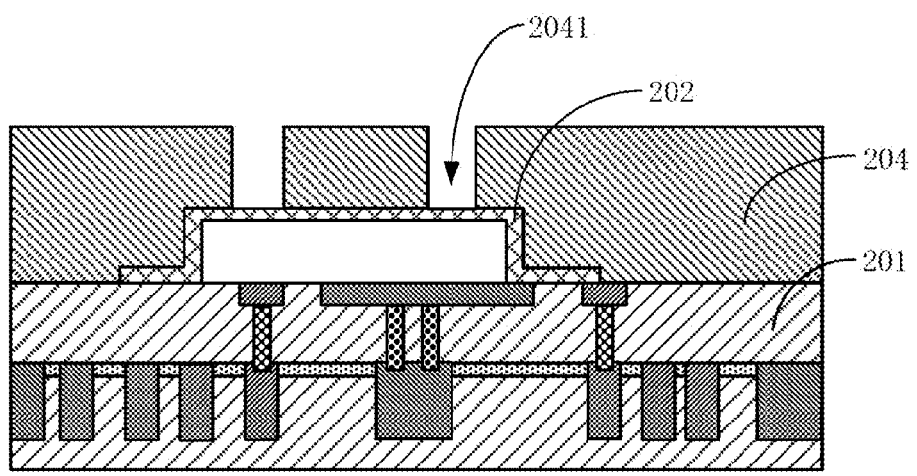

Referring to FIG. 2H, the etch stop assembly 2031 at the bottom of the pressure trench 2041 is removed (Step A6). The mask layer 205 is then removed (Step A7).

The etch stop assembly 2031 may be removed using dry etching, wet etching, or any other suitable method. It is noted that the etching of the etch stop assembly 2031 should have a high etch selectivity between the etch stop assembly 2031 and the pressure sensing film 202, so as to prevent unwanted etching of the pressure sensing film 202.

In some embodiments, the etch stop assembly 2031 may be removed by dry etching using etchant gases including Ar, $CF_4$, and $CHF_3$. In those embodiments, the dry etching process conditions may include: Ar at a flow rate of 200 sccm, $CF_4$ at a flow rate of 15 sccm, $CHF_3$ at a flow rate of 45 sccm, a process pressure of 95 mtorr, and a source power of 300 W. Also, in some embodiments, a wet cleaning step may be performed after the etch stop assembly 2031 has been removed, so as to remove ions/molecules/residue generated by the dry etching.

An exemplary method of manufacturing a MEMS pressure sensor according to an embodiment has been described in the foregoing description. It should be understood that the method may be modified in various ways, for example, by adding process steps after Step A7, and/or inserting additional process steps between Steps A1 through A7.

The above exemplary method includes forming the etch stop assembly 2031 on the pressure sensing film 202 at the location corresponding to the pressure trench, and subsequently removing the etch stop assembly 2031. Accordingly, during the etching of the cover layer 204 to form the pressure trench, unwanted etching of the pressure sensing film 202 at the bottom of the pressure trench 401 can be prevented, thus improving the reliability of the MEMS pressure sensor. In addition, since the etch stop assembly 2031 (and also the etch stop layer) are not disposed between the cover layer 204 and the pressure sensing film 202 in the resulting MEMS pressure sensor, stress (mainly compressive stress) exerted by the etch stop assembly 2031 (and the etch stop layer) would be absent. As a result, deformation (distortion) of the cover layer 204 and the pressure sensing film 202 can be prevented. Accordingly, the sensitivity of the MEMS pressure sensor can be improved, and sensor drift can be prevented.

Next, the structural differences between a MEMS pressure sensor manufactured using the method of FIGS. 1A through 1F, and a MEMS pressure sensor manufactured using the exemplary method of FIGS. 2A through 2H, are compared using SEM photographs of the manufactured MEMS pressure sensors. Specifically, FIG. 4A illustrates a SEM photograph of a MEMS pressure sensor formed using the method of FIGS. 1A through 1F (Steps E1 through E7), and FIG. 4B illustrates a SEM photograph of a MEMS pressure sensor formed using the exemplary method of FIGS. 2A through 2H (Steps A1 through A7).

Figure 4A:
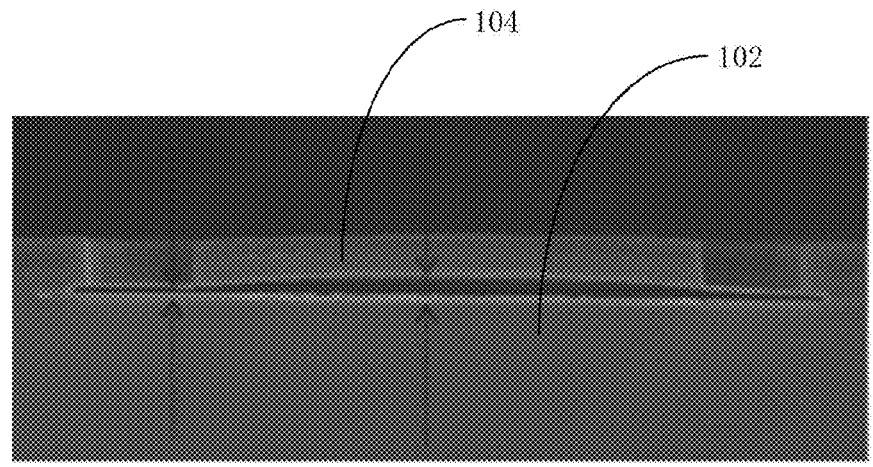
FIG. 4A is a scanning electron microscope (SEM) photograph of a MEMS pressure sensor manufactured using the method of FIGS. 1A through 1F.
Figure 4B:
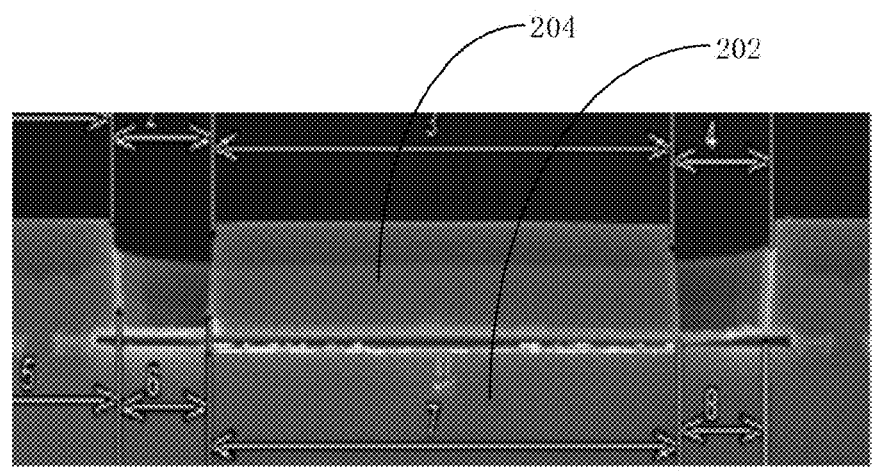
FIG. 4B is a SEM photograph of a MEMS pressure sensor manufactured using the exemplary method of FIGS. 2A through 2H.

Comparing FIG. 4A with FIG. 4B, it is observed that the pressure sensing film 102 and the cover layer 104 in FIG. 4A undergo significant deformation (distortion), whereas the pressure sensing film 202 and the cover layer 204 in FIG. 4B do not undergo any significant deformation (distortion). Accordingly, deformation (distortion) of the pressure sensing film 202 and the cover layer 204 can be prevented in a MEMS pressure sensor manufactured using the exemplary method of FIGS. 2A through 2H, thereby improving the sensitivity of the MEMS pressure sensor and preventing sensor drift.

FIG. 3 is a flowchart of a method of manufacturing a MEMS pressure sensor according to an embodiment. The method of FIG. 3 may include some or all of the steps described with reference to FIGS. 2A through 2H. The method of FIG. 3 includes the following steps:

Step S101: providing a substrate, wherein a bottom electrode and a pressure sensing film are disposed on the substrate; and forming an etch stop assembly on the pressure sensing film at a location corresponding to a pressure trench.

Step S102: forming a cover layer on the substrate covering the etch stop assembly and the pressure sensing film.

Step S103: forming a mask layer on the cover layer, wherein an opening of the mask layer is formed above the etch stop assembly and exposes a portion of the cover layer at the location corresponding to the pressure trench; and etching the cover layer using the mask layer so as to form the pressure trench in the cover layer.

Step S104: removing the etch stop assembly at the bottom of the pressure trench, and removing the mask layer.

It is noted that the MEMS pressure sensor of FIG. 2H, or a MEMS pressure sensor manufactured using the method of FIGS. 2A through 2H and/or FIG. 3, may be incorporated into an electronic apparatus with other electronic components. The MEMS pressure sensor may be connected to the other electronic components (such as switches). As previously described, using the exemplary method, unwanted etching of the pressure sensing film at the bottom of the pressure trench can be prevented, thereby improving the reliability of the MEMS pressure sensor. In addition, deformation (distortion) of the cover layer and the pressure sensing film can be prevented, thereby improving the sensitivity of the MEMS pressure sensor and preventing sensor drift. Accordingly, the electronic apparatus including the exemplary MEMS pressure sensor would also inherit the above desirable characteristics. The exemplary MEMS pressure sensor can be formed on a chip that is then incorporated into the electronic apparatus. The electronic apparatus may include mobile phones, tablet PCs, laptops, netbooks, game consoles, TVs, VCD players, DVD players, navigation systems, cameras, video cameras, voice recorders, MP3/MP4 players, PSPs, and any other electronic products or devices. The exemplary MEMS pressure sensor may also be incorporated into an intermediate product. The intermediate product may be used as stand-alone pressure sensing device, or integrated with other components to form a finished electronic product or device.

Embodiments of a method of manufacturing a MEMS pressure sensor and an electronic apparatus including the MEMS pressure sensor have been described in the foregoing description. To avoid obscuring the inventive concept, details that are well-known in the art may have been omitted. Nevertheless, those skilled in the art would be able to understand the implementation of the inventive concept and its technical details in view of the present disclosure.

Different embodiments of the inventive concept have been described with reference to the accompanying drawings. However, the different embodiments are merely illustrative and are not intended to limit the scope of the inventive concept. Furthermore, those skilled in the art would appreciate that various modifications can be made to the different embodiments without departing from the scope of the inventive concept. Therefore, the inventive concept should not be limited to the foregoing disclosure, but rather construed by the claims appended hereto.

What is claimed is:

1. A method of manufacturing a pressure sensor, comprising:
    providing a substrate, wherein a bottom electrode and a pressure sensing film are disposed on the substrate;
    forming an etch stop assembly on the pressure sensing film at a location corresponding to a pressure trench;
    forming a cover layer on the substrate covering the etch stop assembly and the pressure sensing film;
    forming a mask layer on the cover layer, wherein an opening of the mask layer is formed above the etch stop assembly and exposes a portion of the cover layer at the location corresponding to the pressure trench;
    etching the cover layer using the mask layer so as to form the pressure trench in the cover layer;
    removing the etch stop assembly at a bottom of the pressure trench; and
    removing the mask layer.

2. The method according to claim 1, wherein forming the etch stop assembly further comprises:
    forming an etch stop layer on the substrate covering the pressure sensing film;
    forming a mask layer on the etch stop layer, wherein the mask layer is formed covering a portion of the etch stop layer at the location corresponding to the pressure trench;
    etching the etch stop layer using the mask layer to remove portions of the etch stop layer that are not covered by the mask layer; and
    removing the mask layer.

3. The method according to claim 2, wherein the etch stop layer is etched by dry etching using etchant gases including Ar, $O_2$, and $C_4F_8$.

4. The method according to claim 3, wherein process conditions of the dry etching include: Ar at a flow rate of 150 sccm, $O_2$ at a flow rate of 17 sccm, $C_4F_8$ at a flow rate of 15 sccm, a pressure of 80 mtorr, a source power of 1600 W, and a bias power of 800 W.

5. The method according to claim 1, wherein the etch stop assembly comprises silicon oxide or amorphous carbon.

6. The method according to claim 1, wherein the pressure sensing film comprises SiGe.

7. The method according to claim 1, wherein the cover layer comprises silicon nitride.

8. The method according to claim 1, wherein the cover layer is etched by dry etching using etchant gases including Ar, $O_2$, $CF_4$, and $CHF_3$.

9. The method according to claim 8, wherein process conditions of the dry etching include: Ar at a flow rate of 200 sccm, $O_2$ at a flow rate of 18 sccm, $CF_4$ at a flow rate of 80 sccm, $CHF_3$ at a flow rate of 25 sccm, a process pressure of 125 mtorr, a source power of 1000 W, and a bias power of 1000 W.

10. The method according to claim 1, wherein the cover layer is etched by dry etching using etchant gases including $SF_6$, $CF_4$, $CHF_3$, and Ar.

11. The method according to claim 8, wherein process conditions of the dry etching include: $SF_6$ at a flow rate of 25 sccm, $CF_4$ at a flow rate of 40 sccm, $CHF_3$ at a flow rate of 25 sccm, Ar at a flow rate of 300 sccm, a process pressure of 140 mtorr, a source power of 1700 W, and a bias power of 500 W.

12. The method according to claim 1, wherein the etch stop assembly is removed by dry etching using etchant gases including Ar, $CF_4$, and $CHF_3$.

13. The method according to claim 12, wherein process conditions of the dry etching include: Ar at a flow rate of 200 sccm, $CF_4$ at a flow rate of 15 sccm, $CHF_3$ at a flow rate of 45 sccm, a process pressure of 95 mtorr, and a source power of 300 W.

14. The method according to claim 12, further comprising:
    performing a wet cleaning step after the etch stop assembly is removed.

15. A pressure sensor comprising:
    a substrate;
    a bottom electrode and a pressure sensing film disposed on the substrate;
    a cover layer disposed on the substrate covering the pressure sensing film, wherein the cover layer includes at least one pressure trench formed in the cover layer and directly on top of the pressure sensing film, and wherein the cover layer is disposed in direct contact with the pressure sensing film, and the bottom electrode and the pressure sensing film are in contact with each other.

* * * * *